US007132979B2

(12) United States Patent
Langenberg

(10) Patent No.: US 7,132,979 B2
(45) Date of Patent: Nov. 7, 2006

(54) CALIBRATION APPARATUS FOR A SWITCHABLE ANTENNA ARRAY, AND AN ASSOCIATED OPERATING METHOD

(75) Inventor: Jörg Langenberg, Prien (DE)

(73) Assignee: Kathrein-Werke KG, Rosenheim (DE)

(*) Notice: Subject to any disclaimer, the term of this patent is extended or adjusted under 35 U.S.C. 154(b) by 0 days.

(21) Appl. No.: 10/455,801

(22) Filed: Jun. 6, 2003

(65) Prior Publication Data

US 2004/0032366 A1 Feb. 19, 2004

(30) Foreign Application Priority Data

Aug. 19, 2002 (DE) ............................... 102 37 822

(51) Int. Cl.
*H01Q 3/26* (2006.01)
*H01Q 3/40* (2006.01)
*G01R 3/00* (2006.01)

(52) U.S. Cl. ....................... 342/368; 342/372; 342/373

(58) Field of Classification Search ................ 342/368, 342/174, 373
See application file for complete search history.

(56) References Cited

U.S. PATENT DOCUMENTS 5,086,302 A * 2/1992 Miller ........................ 342/373
5,151,706 A 9/1992 Roederer et al.
5,276,452 A 1/1994 Schuss et al. ............... 342/371
5,477,229 A 12/1995 Caille et al. ................ 342/360
5,502,447 A 3/1996 Kumpfbeck et al. ........ 342/373
5,644,316 A 7/1997 Lewis et al. ................ 342/174
5,784,030 A * 7/1998 Lane et al. ................. 342/373
5,784,031 A 7/1998 Weiss et al.
5,929,804 A 7/1999 Jones et al.
5,936,569 A * 8/1999 Ståhle et al. ................ 342/174
5,940,032 A 8/1999 Passmann et al. .......... 342/372
6,043,790 A 3/2000 Derneryd et al. ........... 343/853
6,046,697 A * 4/2000 Overbury et al. ........... 342/360
6,081,233 A * 6/2000 Johannisson ................ 342/373
6,127,966 A * 10/2000 Erhage ....................... 342/174
6,133,868 A * 10/2000 Butler et al. ................ 342/174
6,157,340 A * 12/2000 Xu et al. .................... 342/174
6,222,486 B1 * 4/2001 Flacke et al. ............... 342/432
6,351,243 B1 2/2002 Derneryd et al. ........... 343/754
6,417,804 B1 7/2002 Merlet et al. ............... 342/368
6,426,726 B1 7/2002 Yablon ....................... 343/754
6,515,616 B1 * 2/2003 Kuplicki ..................... 342/174
6,642,908 B1 * 11/2003 Pleva et al. ................. 343/876
6,647,276 B1 * 11/2003 Kuwahara et al. ....... 455/562.1

(Continued)

FOREIGN PATENT DOCUMENTS

DE 692 00 720 T2 4/1995

(Continued)

OTHER PUBLICATIONS

Peik, S. F. et al., "High-Temperature Superconductive Butler Matrix Beamformer for Satellite Applications," pp. 1543-1546, 1999 IEEE MIT-S Digest (1999).

(Continued)

*Primary Examiner*—Gregory C. Issing
(74) *Attorney, Agent, or Firm*—Nixon & Vanderhye P.C.

(57) ABSTRACT

A calibration device for a switchable antenna array, distinguished by the following improvements provides at least two inputs of two or more available inputs of the beam forming network fed simultaneously and/or jointly and/or in the same phase. The antenna elements have been trimmed in advance in order to produce intermediate lobes or further different azimuth beam directions, such that the individual lobes which are produced when at least two inputs are connected can be added with the correct phase.

22 Claims, 6 Drawing Sheets

U.S. PATENT DOCUMENTS

| | | | | |
|---|---|---|---|---|
| 6,680,698 B1 | 1/2004 | Eiges | ......................... | 342/373 |
| 6,771,216 B1 | 8/2004 | Patel et al. | ................. | 342/368 |

FOREIGN PATENT DOCUMENTS

| | | |
|---|---|---|
| EP | 0 812 027 A2 | 10/1997 |
| EP | 0 877 444 A1 | 11/1998 |
| WO | 8804837 | 6/1988 |
| WO | WO99/54960 | 10/1999 |
| WO | WO01/19101 | 3/2001 |
| WO | WO 01/56186 A2 * | 8/2001 |
| WO | WO 01/58047 A1 | 8/2001 |
| WO | WO 02/052677 A1 * | 7/2002 |

OTHER PUBLICATIONS

Mahmondi, M. et al., “Adaptive Sector Size Control in a CDMA System Using Butler Matrix,” pp. 1355-1359 (1999 IEEE).

* cited by examiner

CALIBRATION APPARATUS FOR A SWITCHABLE ANTENNA ARRAY, AND AN ASSOCIATED OPERATING METHOD

FIELD

The technology herein relates to a switchable antenna array generally of the type including a Butler matrix type beam forming network, and more particularly to a calibration arrangement for such a beam forming network. The technology herein also relates to an associated operating method.

BACKGROUND AND SUMMARY

A known type of antenna array normally has two or more primary antenna elements arranged alongside one another and one above the other, resulting in a two-dimensional array arrangement. These antenna arrays, which are also known by the expression "smart antennas" are used, for example, in the military field for tracking targets (radar). However, recently, these antennas are also being increasingly used for mobile radio, in particular in the 800 MHz to 1000 MHz, and 1700 MHz to 2200 MHz frequency bands.

The development of new primary antenna element systems has also made it possible to construct dual-polarized antenna arrays, in particular with a polarization alignment of +45° or −45° to the horizontal or vertical.

Irrespective of whether they are fundamentally composed of antenna elements with dual polarization or with only single polarization, antenna arrays such as these may be used for determining the direction of the incoming signal. At the same time, however, the transmission direction can also be varied by appropriate trimming of the phase angle of the transmission signals which are fed into the individual columns, that is to say selective beam forming is carried out.

This alignment of the antenna in different horizontal directions is carried out, for example, by means of a beam forming network. A beam forming network such as this may, for example, be formed from a so-called Butler matrix which, for example, has four inputs and four outputs. The network produces a different, but fixed phase relationship between the antenna elements in the individual dipole rows, depending on which input is connected. An antenna design such as this with a Butler matrix has been disclosed, by way of example, in U.S. Pat. No. 6,351,243.

The antenna array which is known from the US patent cited above has, for example, four columns which run in the vertical direction and lie alongside one another in the horizontal direction, and in each of which four antenna elements or antenna element devices are accommodated one above the other. The four inputs for the antenna elements (which in some cases are also referred to as column inputs in the following text) which are arranged in each column are connected to the four outputs of an upstream Butler matrix. By way of example, the Butler matrix has four inputs. This upstream beam forming network in the form of a Butler matrix produces a different but fixed phase relationship between the antenna elements in the four columns in the normal manner depending on which input is connected, that is to say depending on which of the four inputs the connecting cable is connected to. Four different alignments of the main beam direction, and hence of the main lobe, are thus defined. Thus, in other words, the main beam direction can be set to different angular positions in a horizontal plane. Furthermore, of course, and in principle, the antenna array can also be provided with a down tilt device, in addition to this, to vary the depression angle of the main beam direction, and hence of the main lobe.

However, in principle, there are two major problems with antenna arrays such as these using beam forming networks connected in an appropriate manner upstream, for example in the form of a Butler matrix. On the one hand, the main beam direction can generally be adjusted in the azimuth direction only in predetermined steps, which are governed by the different connections corresponding to the number of inputs. By way of example, in the case of a Butler matrix with four inputs and four outputs, only four different azimuth angles can be set on the antenna array in this way.

Furthermore, a specific problem occurs when a Butler matrix is connected upstream for direction forming, since calibration is very complex in this case. This is because the Butler matrix results in the phase angle not being standard. Furthermore, two or more primary antenna elements of the antenna receive a portion of the signal, irrespective of which input of the Butler matrix is connected.

The exemplary illustrative non-limiting technology herein provides a calibration apparatus for a switchable antenna array, in particular for an antenna array with an upstream beam forming network, for example in the form of a Butler matrix, such that the improved calibration will allow the antenna array to be adjusted in the azimuth direction without any problems, with an even greater number of different angles for the beam direction. The exemplary illustrative non-limiting technology herein also provides an appropriate operating method for operating a corresponding antenna array.

It is surprising that it has now become possible, according to an exemplary illustrative non-limiting implementation, to use a beam forming network which is already known per se, for example in the form of a Butler matrix, to adjust the azimuth direction of the antenna array for further angular alignments in addition independently of the predetermined, for example, four, different inputs (via which the antenna can be set to four different transmission angles in the azimuth direction). According to a non-limiting implementation, this is possible in that at least one input of the beam forming network, for example in the form of the Butler matrix, but preferably at least two inputs of this network, is or are fed with an appropriately trimmed and calibrated phase angle, so that it is possible according to produce intermediate lobes, by way of example. It is thus possible to set the transmission directions of the antenna array to additional intermediate angles as well as the predetermined main angles.

In an exemplary illustrative non-limiting implementation, this is possible by phase trimming in advance for the antenna elements which are fed via the Butler matrix, in order that the individual lobes add in the correct phase when, for example, two inputs are connected.

This is preferably achieved in that it is possible to shift the phases upstream of the inputs of the beam forming network, for example in the form of the Butler matrix, at least with respect to the antenna elements which are arranged in some of the columns of the antenna array, such that the antenna elements which are fed are driven appropriately while at the same time connecting two or more inputs in order to achieve the desired swiveling of the lobe.

In the case of a 4×4 antenna array with four columns and in each case four antenna elements or antenna element groups, the phase angles of all the antenna elements are preferably shifted appropriately at the same time.

The calibration of the phase angle can preferably be carried out by means of phase control elements which are connected upstream of the corresponding inputs of the Butler matrix. Alternatively, this can also be carried out by using upstream additional lines to the Butler matrix, which must be chosen to have a suitable length to produce the desired phase trimming.

It has also been found to be advantageous to place appropriate probes on the antenna array itself, via which appropriate calibration signals can be received, in order to carry out the phase trimming by means of a calibration network.

Finally, still further improvement can also be achieved by the combination network containing lossy components. This is because these components contribute to reducing resonances.

Although the phase angle of the transmission from the input of the individual columns or of the antenna inputs is preferably of the same magnitude, the phase angle (or the group delay time) will, however, in practice differ to a greater or lesser extent from the ideal phase angle, due to tolerances. The ideal phase angle is that at which the phase for all the paths is identical, to be precise with respect to the beam forming as well. The discrepancies, which are to a greater or lesser extent dependent on the tolerance, are produced additively as an offset, or else as a function of frequency as a result of different frequency responses. The exemplary illustrative non-limiting implementation herein proposes here that the discrepancies be measured over all the transmission paths, preferably on the path from the input to the antenna array or beam forming network to the probe output or input to probe outputs, and preferably over the entire operating frequency range (for example during production of the antenna). If coupling devices are used, the transmission paths are preferably measured over the path from the input to the antenna array or beam forming network to the coupling output or coupling outputs. This determined data can then be stored in a data record. This data, which is stored in suitable form, for example in a data record, can then be made available to a transmitting device or to the base station in order then to be taken into account for producing the phase angle of the individual signals electronically. It has been found to be particularly advantageous, for example, to associate this data, or the data record which has been mentioned, with the corresponding data for a serial number of the antenna.

BRIEF DESCRIPTION OF THE DRAWINGS

These and other features and advantages will be better and more completely understood by referring to the following detailed description of exemplary non-limiting illustrative implementations in conjunction with the drawings of which.

DETAILED DESCRIPTION

Figure 1:
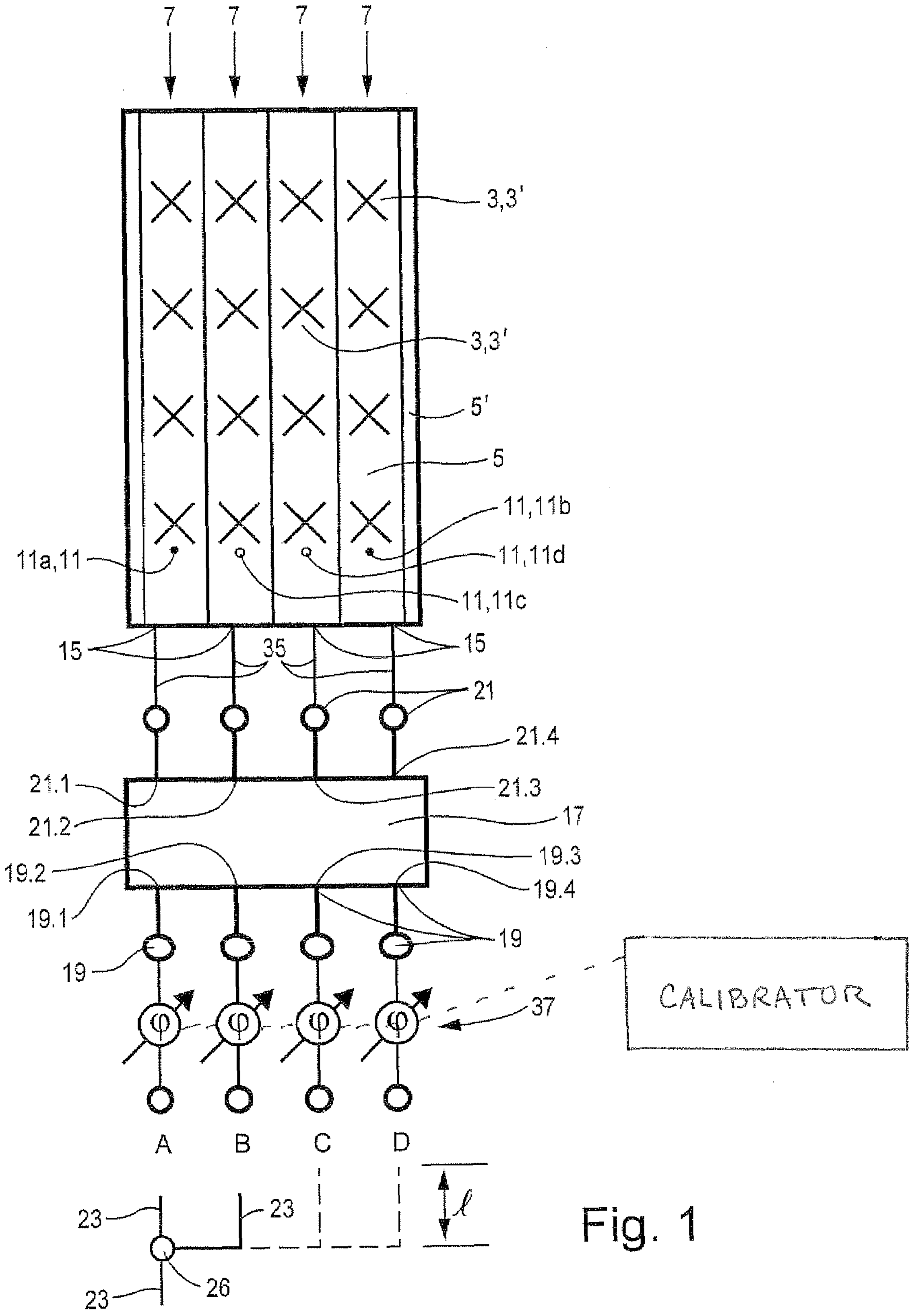
FIG. 1 shows a schematic plan view of an exemplary non-limiting illustrative antenna array implementation, showing probes for a calibration device.

FIG. 1 shows a schematic plan view of an exemplary illustrative non-limiting implementation of an antenna array 1 which, for example, has a large number of dual-polarized antenna elements 3 arranged in front of a reflector 5. An edge boundary 5', which belongs to the reflector, can be provided, for example, on the vertical longitudinal sides of the reflector 5 and is positioned at an angle of up to 90° with respect to the plane of the reflector plate. These reflector edge boundaries 5' are often positioned such that they are inclined slightly outwards in the transmission direction.

In the illustrated exemplary implementation, the antenna array has four columns 7 which are arranged vertically, with four antenna elements or antenna element groups 3 being arranged one above the other in each column in the illustrated exemplary implementation.

Figure 2:
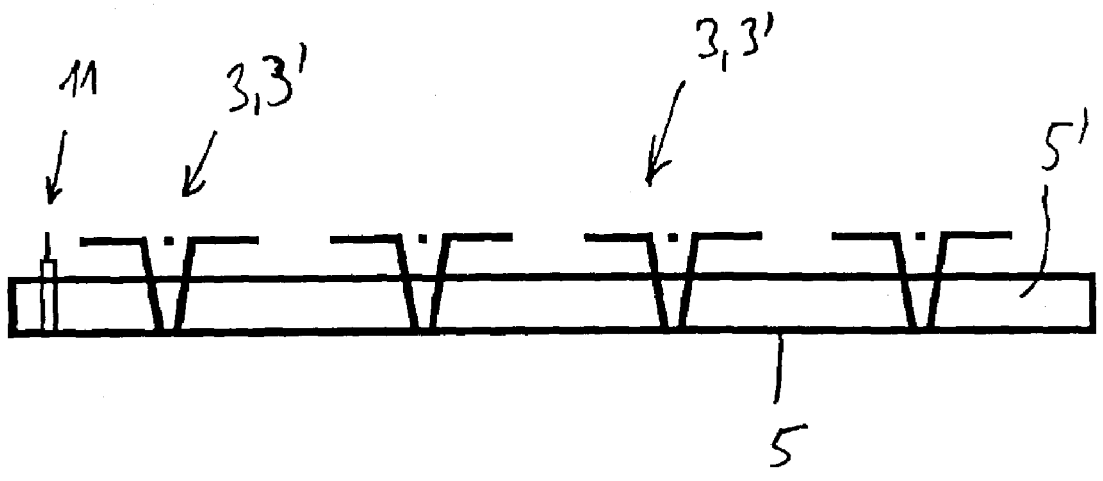
FIG. 2 shows a schematic detail of a vertical cross-sectional illustration along a vertical plane through one column of the antenna array shown in FIG. 1.

Overall, four columns 7 are provided in the antenna array shown in FIGS. 1 and 2, in each of which the four antenna elements or antenna element groups 3 are positioned one above the other in the vertical direction. The individual antenna elements or antenna element groups 3 need not necessarily be arranged at the same height in the individual columns. For example, the antenna elements or antenna element groups 3 in each case in two adjacent columns 7 may preferably be arranged offset with respect to one another by half the vertical separation between two adjacent antenna elements. In contrast to this, the schematic plan view shown in FIG. 1 depicts an exemplary non-limiting illustration in which the antenna elements or antenna element groups 3 in adjacent columns are each located on the same horizontal line.

In the case of a dual-polarized antenna as indicated in FIGS. 1 and 2, the antenna elements 3 may, for example, comprise cruciform dipole antenna elements, or dipole squares. Dual-polarized dipole antenna elements 3' such as those which are known, for example, from WO 00/39894 are particularly suitable. Reference is hereby made to the entire disclosure content of this prior publication and with regard to the content of this application.

Finally in FIG. 1, a beam forming network 17 is also provided which, for example, has four inputs 19 and four outputs 21. The four outputs of the beam forming network 17 are connected to the four inputs 15 of the antenna array. The number of outputs N need not be the same as the number of inputs n, that is to say, in particular, the number of outputs N may be greater than the number of inputs n. In the case of a beam forming network 17 such as this, a feed cable 23 is then, for example, connected to one of the inputs 19, via which all of the outputs 21 are fed in an appropriate manner.

Figure 3:
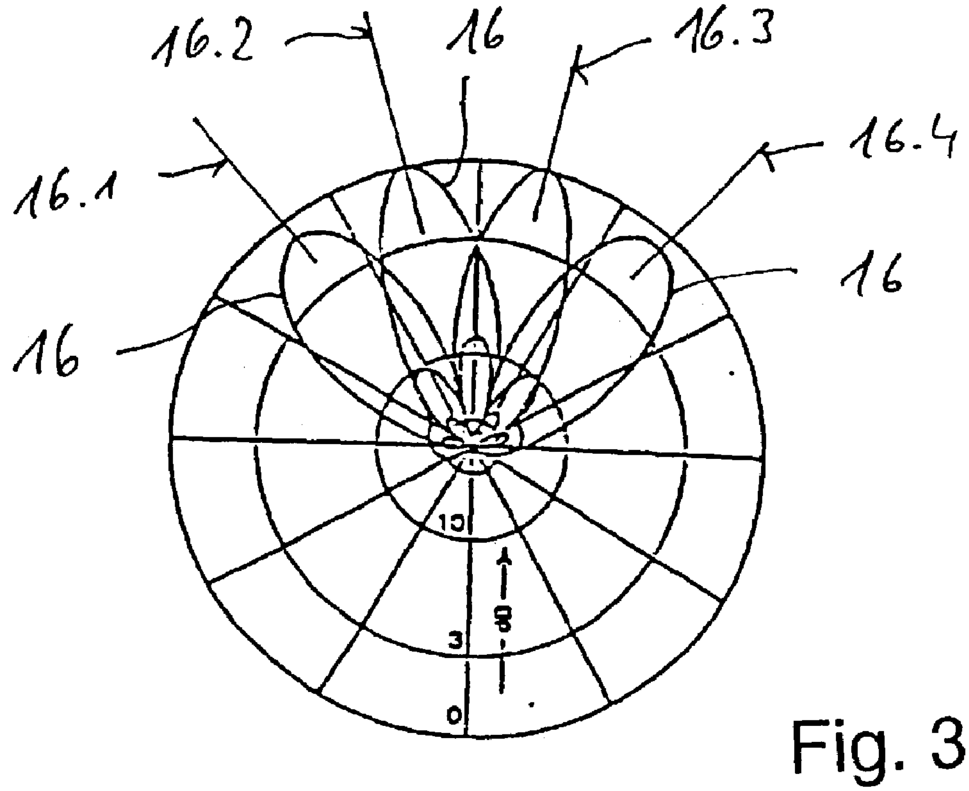
FIG. 3 shows an illustration of four exemplary typical horizontal polar diagrams, which are produced by an antenna array with the aid of a Butler matrix.

Thus, for example, if the feed cable 23 is connected to the first input 19.1 of the beam forming network 17, it is possible to produce a horizontal antenna element alignment 16.1 of, for example, −45° to the left, as can be seen from the schematic diagram shown in FIG. 3. If, for example, the feed cable 23 is connected to the connection 19.4 on the extreme right, then this results in a corresponding alignment 16.4 of the main lobe 16 of the radiation field of the antenna array at an angle of +45° to the right. In a corresponding manner, if the feed cable 23 is connected to the connection 19.2 or to the connection 19.3, the antenna array can be operated such that, for example, it is possible to swivel the beams 16.2, 16.3 through 15° to the left or to the right with respect to the vertical plane of symmetry of the antenna array, that is to say in different azimuth directions.

It is thus normal with a beam forming network 17 of this type to provide a corresponding number of inputs for different azimuth angular alignments of the main lobe 16 from the antenna array, with the number of outputs generally corresponding to the number of columns of the antenna array. In this case, each input is connected to a large number of outputs of the beam forming network 17, generally with each input being connected to all the outputs of the beam forming network 17.

The beam forming network 17 may, for example, be a known Butler matrix 17', whose four inputs 19.1, 19.2, 19.3, and 19.4 are each connected to all the outputs 21.1, 21.2, 21.3 and 21.4, with the antenna elements 3 being fed via lines 35.

However, in the case of a beam forming network 17 in the form of a Butler matrix 17' by way of example, which in principle allows the different settings of the main beam direction 16 as shown in FIG. 3, if it is desired that it should be possible to adjust the main beam direction to other azimuth angle positions as well, then, in principle, this cannot be done. This is because the connection of the feed cable 23 to one of the inputs 19.1 to 19.4 allows in each case only one alignment of the main beam direction as shown in FIG. 3.

However, in order at the same time also to allow intermediate main lobes 16 or intermediate positions or other angular settings in addition to those shown in the diagram in FIG. 3, the exemplary illustrative non-limiting implementation connects the feed cable 23 via a branching or addition point 26 not only to one input but to at least two or more of the inputs 19.1 to 19.4.

On its own, however, this may not lead to a useable result. This is because it has been found that corresponding production of further intermediate lobes in the "gaps" in the diagram shown in FIG. 3 is feasible only if appropriate phase trimming is carried out first of all upstream of the Butler matrix, that is to say upstream of the beam forming network 17, in order that the individual lobes can be added correctly.

To do this, the Butler matrix and the antenna array that is connected ist first of all calibrated. First of all, this involves measurement of the phase profile at the outputs 21.1 to 21.4 of the beam forming network 17, preferably in the form of the Butler matrix 17', to be precise as a function of the feed signal being supplied firstly via the input 19.1, 19.2, 19.3 or 19.4 of the Butler matrix 17'. Depending on which input 19.1 to 19.4 is connected, the beam forming network 17 in the form of the Butler matrix 17' produces different radiation polar diagrams owing to the different phase angles of the dipoles or dipole rows, that is to say of the antenna elements 3, 3'. For example, four different horizontal polar diagrams are produced if the antenna elements 3, 3' in the four columns 7 are arranged vertically. The diagram in FIG. 4 shows the phase relationships between the antenna elements in the individual columns.

Figure 4:
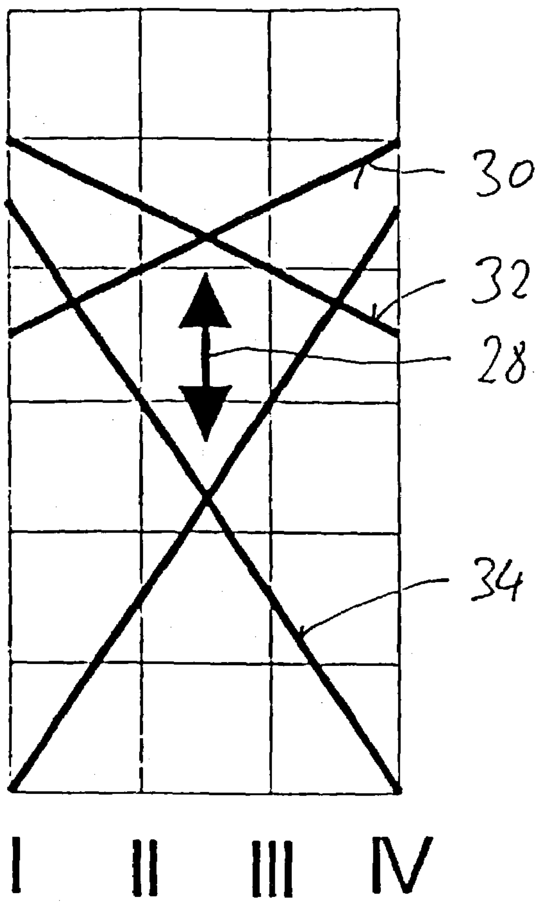
FIG. 4 shows a diagram to explain the phase relationship between the antenna elements in the individual columns before carrying out the calibration process.

The Roman numerals I to IV at the bottom of the diagram in FIG. 4 indicate the four inputs 19.1 to 19.4. Relative phase relationships or phase differences are shown (for example in degrees) in each case on the Y axis. This results in the measurement curves in the form of four straight lines, as shown in the diagram in FIG. 4.

In the case of the dual-polarized antennas that have been explained by way of example using dual-polarized antenna elements 3', a sudden phase change may occur, for example, of, for example, 180° between the primary antenna elements 3, 3' for the different polarizations.

Figure 5:
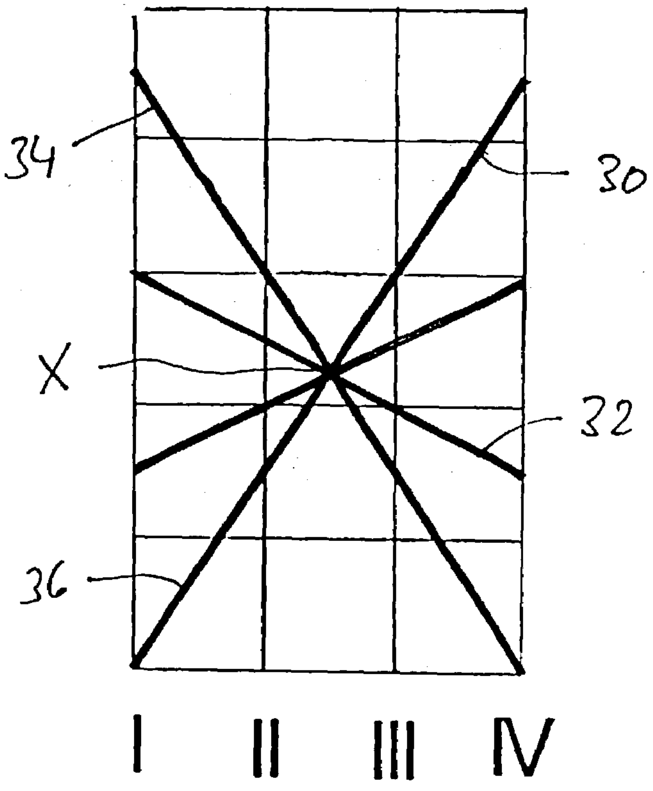
FIG. 5 shows an illustration corresponding to that in FIG. 4, after the calibration process has been carried out.

In order now to carry out the phase trimming process for all the inputs 19.1 to 19.4 of the beam forming network 17, for example in the form of the Butler matrix 17', the positions of the measurement curves (straight lines) shown in FIG. 4 must be changed as indicated by the arrows 28, such that the two upper measurement curves in the form of the straight lines 30 and 32 intersect the two measurement curves 34 and 36, which are located lower down and have a steeper profile in FIG. 4, at a common intersection point X, as is shown in FIG. 5.

Thus, in other words, an appropriate phase adjustment may now be carried out, for example by means of suitable phase control elements in the illustrated exemplary implementation, either with respect to the inputs 19.1 and 19.4, or with respect to the inputs 19.2 and 19.3, in order to obtain a common intersection point as shown in FIG. 5. By way of example, this may be done, in a corresponding manner to that shown in the illustration in FIG. 1, by phase control elements 37 which are connected upstream of the inputs 19.1 to 19.4 of the Butler matrix 17', thus resulting in inputs A to D for the overall circuit. Appropriate additional cable lengths may be connected upstream to the individual inputs 19.1 to 19.4, instead of the phase control elements 37 shown in FIG. 1, whose lengths are designed so as to achieve the desired phase shift.

Figure 6:
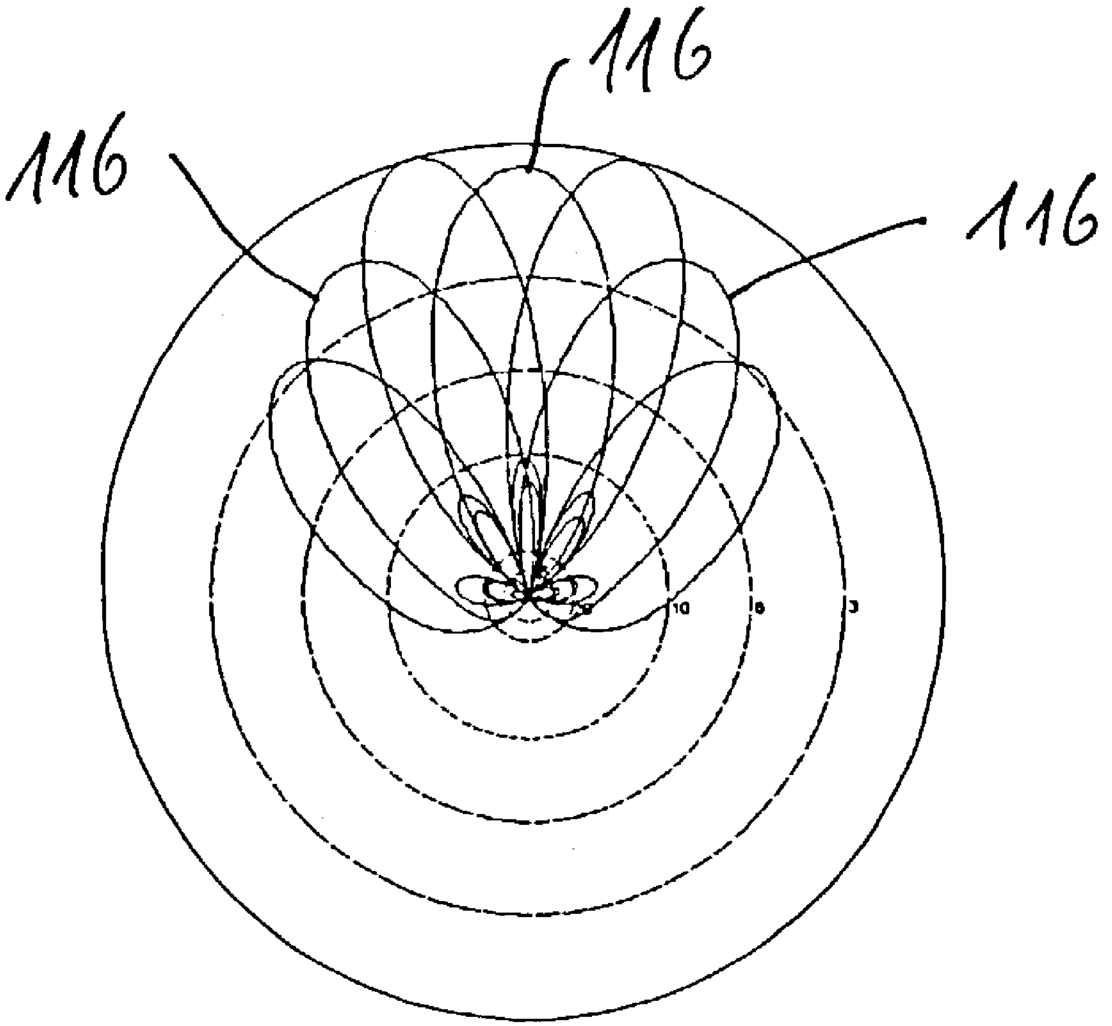
FIG. 6 shows an illustration corresponding to that in FIG. 3, of typical exemplary horizontal polar diagrams of the antenna array, from which it can be seen that further intermediate lobes can be produced.

Once a phase trimming process such as this has been carried out, it is now possible to produce intermediate lobes 116, as are shown by way of example in the diagram in FIG. 6 for the situation where the inputs 19.1 and 19.2 or 19.2 and 19.3, or 19.3 and 19.4 are interconnected. All the inputs are preferably supplied with the same power.

The desired calibration process as explained above can now be carried out by means of an exemplary non-limiting arrangement with a very small number of probes or coupling devices. In the prior art, calibration devices such as this are sometimes positioned at the input of the beam forming network. In contrast to this, the present exemplary non-limiting arrangement proposes that the output be connected directly to the individual columns. This offers better accuracy since this results in the tolerances of the Butler matrix being calibrated out, while it is also possible to reduce the number of coupling devices required.

Figure 7:
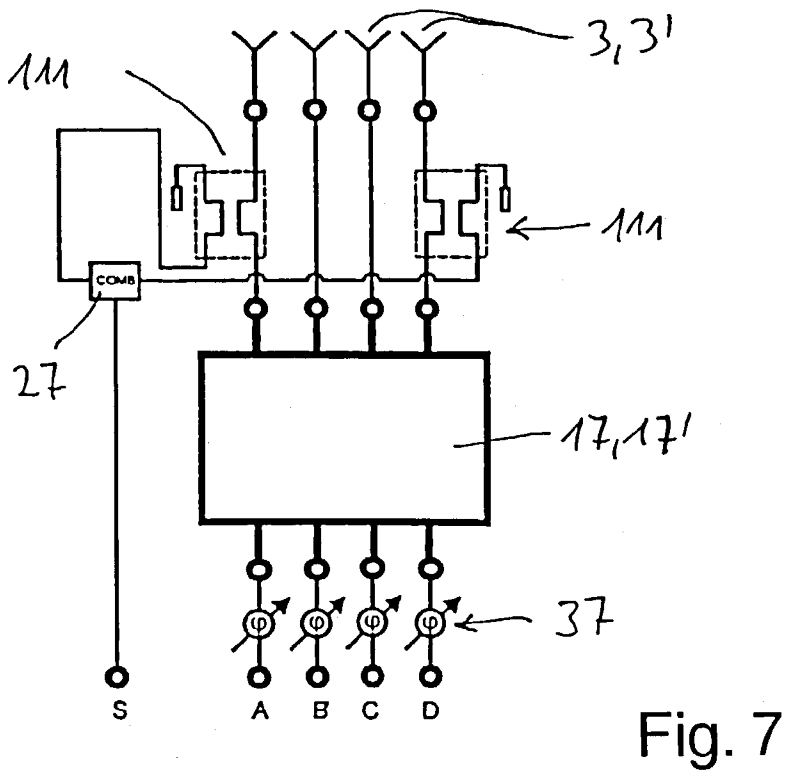
FIG. 7 shows an illustrative exemplary non-limiting implementation of a calibration device with a combination network using coupling devices.

FIG. 7 now shows an exemplary illustrative non-limiting implementation of an apparatus for phase trimming of the supply lines, that is to say for carrying out a phase calibration process. The phase trimming process which has been mentioned is carried out for the intermediate lobes 116 using the phase control elements of the Butler matrix 17', in order that these intermediate lobes 116 can be made use of in a worthwhile manner and without any further measures on the antenna supply lines, by combinations of inputs A and B, B and C or C and D.

Two couplers 111 which are as identical as possible and which each output a small proportion of the respective signals are now provided at the outputs 21.1 and 21.4 (or 21.2 and 21.3). The output signals are added in a combination network 27 (which is a "combiner", referred to for short in the drawing as a "Comb."). The result of the outputting of the signals and of the addition can be measured via an additional connection S on the combination network 27.

For phase trimming of the supply lines to the Butler matrix 17', a suitable calibration signal, that is to say a known signal, is now output, for example, on the supply line for the input A, and the absolute phase is measured at the output S of the combination network (Comb). This can now also be done for the supply lines to the inputs B, C and D.

If all of the supply lines to the inputs A to D are (electrically) of exactly the same length (and they can also otherwise be regarded as being identical), then the same absolute phase is in each case produced at the output of the combination network, that is to say there is no phase difference at the output S while the connections of the inputs A to D are changed.

The situation in which the same phase value is indicated with identical supply lines to the connections A to D is made possible in the exemplary non-limiting illustrative implementation by the phase trimming for the intermediate lobes 116 at the input, since this measure results in the sum of the phases at the outputs 21.1 and 21.4 or 21.2 and 21.3 (that is to say at the outputs at which the couplers are located) with respect to the inputs A to D always being twice the value of the intersection point X of the four straight lines, as is indicated in FIG. 5.

It can thus be seen from the illustration in FIG. 7 that the couplers 111 are preferably connected between the respective output 21 and the respective input 15 of the associated column 7 of the antenna array. Thus, in principle, the couplers must be connected between the network that is accommodated in an integrated form in the Butler matrix 17' and at least one antenna element 3, 3' in an associated column 7 of the antenna array.

Figure 8:
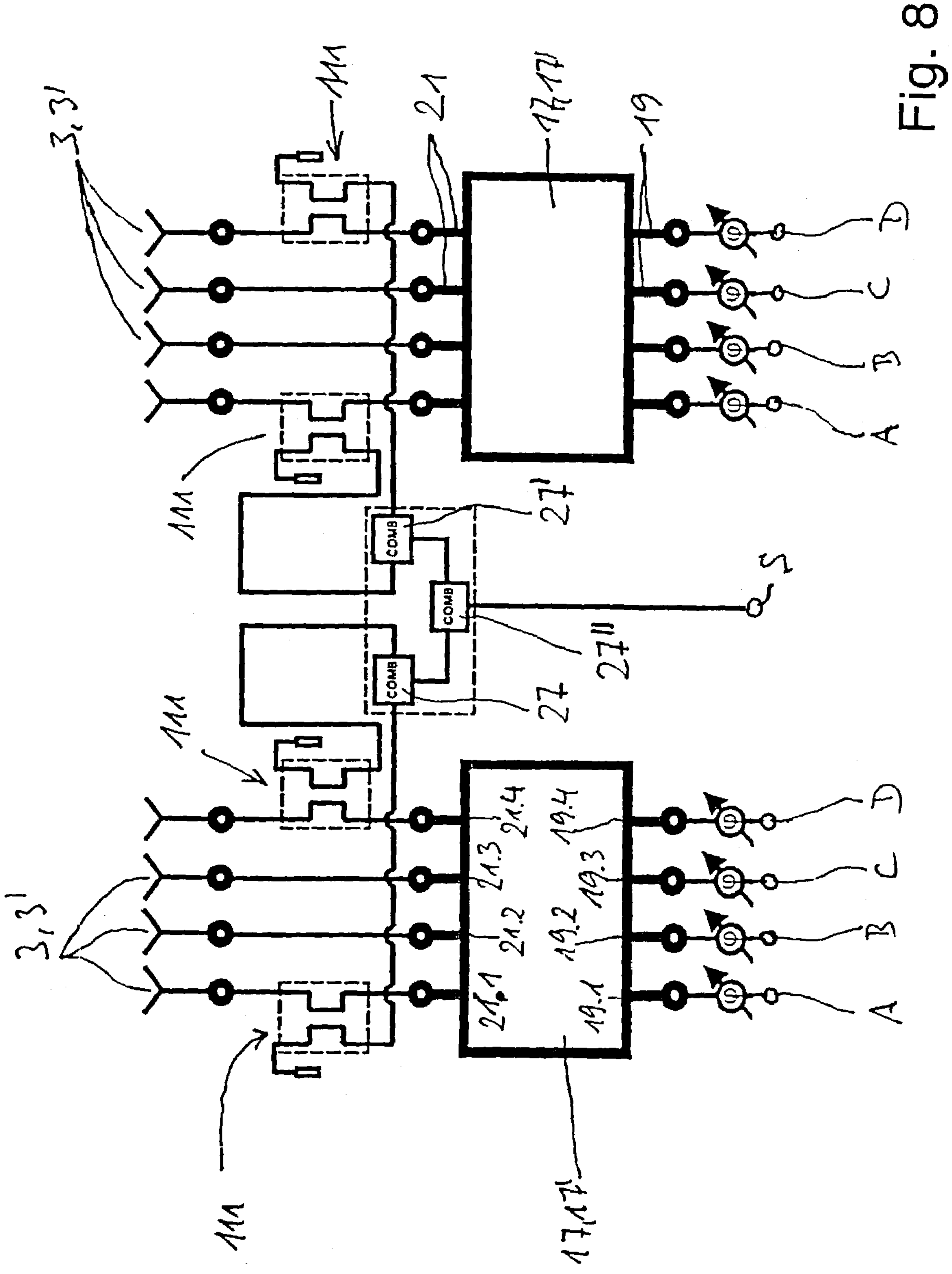
FIG. 8 shows an illustrative non-limiting example of an extended calibration device, based on FIG. 7, for an antenna with two polarizations which, by way of example, are aligned at +45° and −45° to the horizontal.

FIG. 8 shows how the network for phase trimming of the supply lines can be combined for an antenna with two polarizations, for example +45° and −45°. A combination such as this is worthwhile when, for example, the Butler matrix can be provided together with the couplers and combination networks on a board, since this means that largely identical units (couplers and combination networks in each case) can be produced.

The extension from the illustration in FIG. 7 comprises the two outputs of the respective combination network 27 and 27', for example in the form of a combiner (Comb) being combined with the inputs of a downstream second combination network 27", likewise in the form of a combiner (Comb), and being connected to the common output S. The combination network 27 is thus used for determining the phase angle at one antenna element with respect to one polarization, with the combination network 27' being used to determine the phase angle at a relevant antenna element for the other polarization.

It should also be mentioned, merely for the sake of completeness, that, in principle, it would be possible to set the phase control elements at the input of the beam-forming network 17, that is to say for example of the Butler matrix 17', such that, at the output of each matrix, only one coupler would in each case be required, with the same phase nevertheless always being measured irrespective of the input A to D. In this case as well, the phase control elements may comprise line sections which can in principle be connected upstream, in order to vary the phase angle.

It is likewise, of course, possible to arrange in each case one coupler 111, for example in the form of a directional coupler, on all four lines 35, in order to provide even more measurement points for achieving the straight lines shown in the diagrams in FIGS. 4 and 5.

Figure 9:
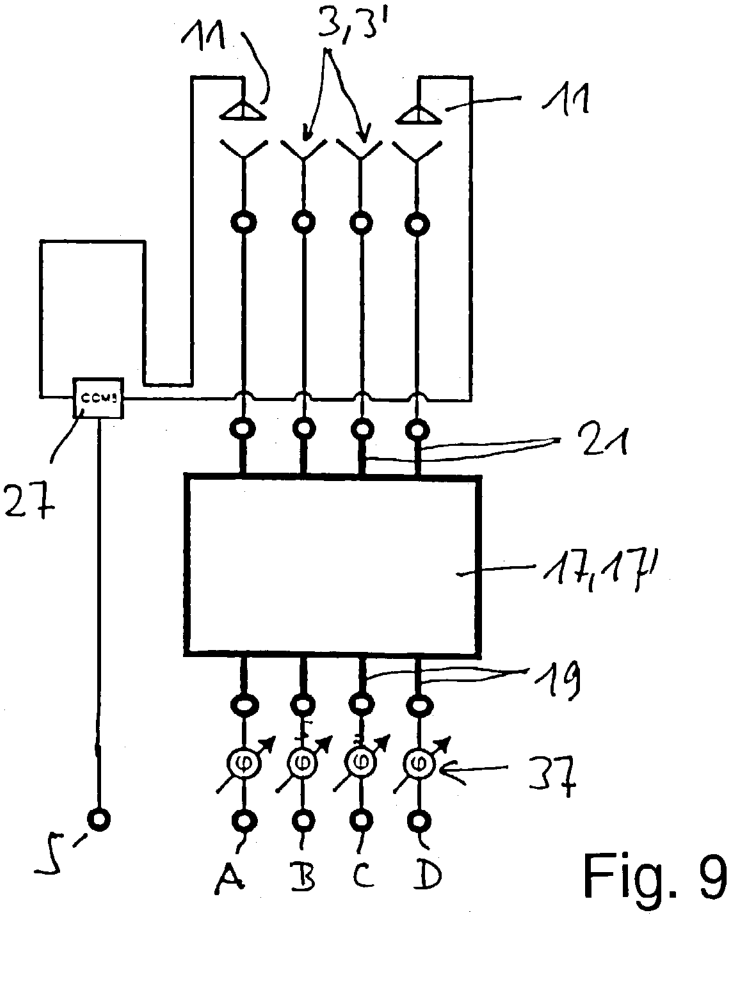
FIG. 9 shows an illustration, corresponding to that in FIG. 7, of an exemplary illustrative non-limiting implementation of a calibration device which uses probes (which can be installed on an antenna array by the factory) rather than coupling devices.

However, it is also possible to use probes 11 instead of the couplers 111 which have been mentioned, which, for example, are in the form of pens, preferably project at right angles from the plane of the reflector plate 5, and are in this case associated with a specific antenna element 3. The probes 11 may preferably consist of capacitive coupling pins. However, they may also be formed from inductively operating coupling loops. In both case, the probes 11 project out of the reflector into the near field of the antenna elements. The probes 11 which have been mentioned may also be used for dual-polarized antenna elements 3', since they can be used to measure both polarizations. By way of example, FIG. 1 shows a plan view of a probe 11 and 11*b* such as this, in each case associated with the lowermost antenna elements 3, 3', for the left-hand and right-hand columns. This probe is then used instead of the directional couplers 11 which are shown in FIGS. 7 and 8, in order to evaluate the signal which is measured via them in a combination network 27 or, in the case of a dual-polarized antenna, in a combination network 27' and 27". FIG. 9 shows a combination network 27 which operates with two probes 11, that is to say 11*a* and 11*b*.

In principle, it is, of course, also once again possible to use four probes, that is to say precisely the same number of probes as the number of columns that are provided. In principle, it is also feasible to use only a single probe in order in this way to define the fixed predetermined phase relationship between the antenna elements in the individual columns.

The combination networks are suitable for single-polarized antennas. In principle, they are also suitable for a dual-polarized antenna array. The use of probes 11 is particularly suitable in this case, since a single probe is sufficiently associated with a dual-polarized antenna arrangement 3, 3' since, in the end, the desired signal elements in both polarizations can be received via this single probe. In the case of a coupling device, a coupling device would then have to be provided for each polarization, that is to say, in the case of a dual-polarized antenna array, a pair of coupling devices would then be required instead of one probe.

While the technology herein has been described in connection with exemplary illustrative non-limiting embodiments, the invention is not to be limited by the disclosure. The invention is intended to be defined by the claims and to cover all corresponding and equivalent arrangements whether or not specifically disclosed herein.

The invention claimed is:

1. A method of calibrating a switchable antenna array having a radiation pattern, said antenna array including at least two vertical columns each having at least two antenna elements arranged one above the other, the antenna elements having inputs, said array of the type further including a beam forming network including a Butler matrix connected to the antenna element inputs, the Butler matrix having inputs and outputs and having phase control elements connected to the inputs thereof, the Butler matrix outputs being connected to feed the antenna element inputs in at least one of said columns, the beam forming network producing a different phase relationship between the plural antenna elements depending on which of plural inputs of said Butler matrix are connected to a common feed, in order to achieve a desired beam direction in the azimuth direction, the method comprising:

feeding at least two of said inputs of the beam forming network simultaneously via a common feed cable arrangement, receiving and processing signals produced by fewer probes associated with a vertical column than there are antenna elements of said vertical column; and at least in part in response to said received and processed signals, calibrating said antenna array to provide antenna radiation pattern adjustment in azimuthal direction for intermediate azimuthal angles, including trimming the phase control elements to cause the characteristic phase differences associated with the Butler Matrix inputs to intersect at a common calibration point, thereby producing radiation pattern intermediate lobes providing further different azimuth beam directions, such that the radiation pattern lobes produced when at least two inputs are connected can be added with predetermined desired phase.

2. The calibration method for a switchable antenna array according to claim 1, further including using the phase control elements for phase shifting the beam forming network inputs.

3. The calibration method for a switchable antenna array according to claim 1, further including connecting additional lines of a predetermined length to selected inputs of the beam forming network for phase trimming all beam forming network outputs.

4. The calibration method for a switchable antenna array according to claim 1, further including providing a calibration network for trimming the phases of the antenna elements arranged in the columns.

5. The calibration method for a switchable antenna array according to claim 1, further including providing a calibration network, and wherein the receiving and processing step includes using at least one probe associated with a respective antenna element, said probe providing a signal element to the calibration network during a calibration phase for defining phase trimming.

6. The calibration method for a switchable antenna array according to claim 1, further including providing a calibration network, and providing at least one coupling device associated with an antenna element for at least one column, said coupling device supplying a signal element to the calibration network during a calibration phase to allow phase trimming to be defined.

7. The calibration method for a switchable antenna array according to claim 6, including arranging the coupling device between the respective output of the beam forming network and the associated input of the antenna array.

8. The calibration method for a switchable antenna array according to claim 1, further including providing a calibration device between the beam forming network and the antenna elements.

9. The calibration method for a switchable antenna array according to claim 1, wherein said providing includes arranging at least one probe near the antenna elements.

10. The calibration method for a switchable antenna array according to claim 1, wherein the providing includes forming an inductively operating probe in the form of a small induction loop.

11. The calibration method for a switchable antenna array according to claim 6, wherein the antenna array provides dual polarization, and said providing includes providing at least first and second coupling devices for corresponding first and second polarizations.

12. The calibration method according to claim 1, wherein the antenna array provides dual polarization, and the providing includes providing at least one probe for receiving a signal for each of said dual polarizations.

13. The calibration method according to claim 1, wherein said calibrating comprises using no probes for at least one antenna element per column.

14. The calibration method according to claim 1, wherein the calibrating comprises using a probe or coupling device for only some of the columns.

15. The calibration method according to claim 1, wherein said calibrating includes using at least one probe in a vertical plane of symmetry, passing through the antenna elements.

16. The calibration method according to claim 1, wherein the antenna array has four columns including two outer columns, and said calibrating includes using signals from only two probes arranged in the two outer columns of the antenna array.

17. The calibration method according to claim 1, wherein the antenna array has four columns including two inner columns, and said calibrating includes using two probes arranged in the two inner columns of the antenna array.

18. The calibration method according to claim 1, wherein the calibrating includes using plural probes arranged on the same horizontal line.

19. The calibration method according to claim 1, wherein the antenna array includes two adjacent columns, and wherein the calibrating includes using signals from plural probes having the same coupling loss for two adjacent columns of an antenna array.

20. A calibratable, switchable antenna array having a radiation pattern, said antenna array comprising:

at least two vertical columns each having at least two antenna elements arranged one above the other, the antenna elements having inputs;

a beam forming network including a Butler matrix connected to the antenna element inputs, the Butler matrix having inputs and outputs, phase control elements being connected to said Butler matrix inputs, the phase control elements being trimmed to cause phase differences associated with different Butler matrix inputs to converge at common calibration point, thereby producing intermediate lobes of said radiation pattern providing further different azimuth beam directions such that the radiation pattern lobes produced when at least two inputs of Butler Matrix are fed can be added with predetermined desired phase, the Butler matrix outputs being connected to associated antenna array element inputs via which the antenna elements which are provided in at least one column are fed, the beam forming network producing a different phase relationship between the antenna elements which are arranged in the individual columns depending on which of said Butler matrix inputs is connected, in order to achieve a desired beam direction in the azimuth direction;

a common feed arrangement coupled to said beam forming network inputs, said feed arrangement feeding at least two of said inputs of the beam forming network simultaneously;

at least one probe coupled to the antenna array and positioned in the near field thereof, said probe providing a calibration signal, the number of probes used for calibrating a vertical column being less than the number of antenna elements in the column; and a calibrator coupled to at least said beam forming network phase control elements, said calibrator electronically calibrating said antenna array in response to said calibration signal so as to determine the antenna's azimuthal radiation angle, the phase control elements connected to the inputs of the beam forming network acting to adjust the phases of the signals fed to the inputs thereof to thereby cause the antenna array to produce intermediate lobes directed to further different azimuth beam directions.

21. The antenna of claim 20 wherein some of said antenna elements have no probes associated therewith so there is less than one-to-one correspondence between probes and antenna elements.

22. The antenna of claim 20 wherein said phase relationship between the antenna elements is fixed.

* * * * *